(12) United States Patent
Kim

(10) Patent No.: US 6,723,588 B2
(45) Date of Patent: Apr. 20, 2004

(54) METHOD FOR FABRICATING SRAM CELL

(75) Inventor: Jeong Soo Kim, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/637,619

(22) Filed: Aug. 11, 2003

(65) Prior Publication Data
US 2004/0033647 A1 Feb. 19, 2004

Related U.S. Application Data

(62) Division of application No. 10/012,491, filed on Dec. 12, 2001, now Pat. No. 6,635,966.

(30) Foreign Application Priority Data

Apr. 30, 2001 (KR) ........................................ 2001-23404

(51) Int. Cl.$^7$ .............................................. H01L 21/00
(52) U.S. Cl. ...................................................... 438/154
(58) Field of Search ................................ 438/154, 230, 438/233, 238

(56) References Cited

U.S. PATENT DOCUMENTS

| | | | |
|---|---|---|---|
| 5,573,963 A | 11/1996 | Sung | 257/27.076 |
| 5,656,861 A | 8/1997 | Godinho et al. | 257/758 |
| 5,710,073 A | 1/1998 | Jeng et al. | 438/239 |
| 5,909,618 A | 6/1999 | Forbes et al. | 438/242 |
| 5,990,021 A | 11/1999 | Prall et al. | 438/745 |
| 6,010,933 A | 1/2000 | Cherng | 438/253 |
| 6,066,528 A | 5/2000 | Fazan et al. | 257/27.104 |
| 6,074,960 A | 6/2000 | Lee et al. | 438/749 |
| 6,140,684 A | 10/2000 | Chan et al. | 257/368 |
| 6,156,634 A | 12/2000 | Liou | 438/608 |
| 6,159,844 A | 12/2000 | Bothra | 438/637 |
| 6,187,664 B1 * | 2/2001 | Yu | 438/627 |
| 6,207,543 B1 | 3/2001 | Harvey et al. | 438/586 |
| 6,207,575 B1 | 3/2001 | Yang et al. | 438/716 |
| 6,274,424 B1 | 8/2001 | White, Jr. et al. | 438/239 |
| 6,287,951 B1 | 9/2001 | Lucas | 438/618 |
| 2002/0048920 A1 * | 4/2002 | Pan | 438/595 |
| 2002/0182822 A1 * | 12/2002 | Mandelman et al. | 438/406 |

* cited by examiner

Primary Examiner—David Nelms
Assistant Examiner—Quoc Hoang
(74) Attorney, Agent, or Firm—Birch, Stewart, Kolasch & Birch, LLP

(57) ABSTRACT

A method of fabricating the SRAM cell is disclosed. The method includes forming a gate on a substrate, forming an oxidation barrier film on side portions of the gate, oxidizing the resultant structure by using an oxidation process to form an oxide film on a top surface of the gate, implanting high density impurity ions to the substrate to form a lightly doped region and a highly doped region in the substrate at side portions of the gate, forming an insulating layer over the substrate to define a contact hole that exposes portions of the gate and the highly doped region, and forming an interconnect in the contact hole to connect the gate and the highly doped region.

21 Claims, 6 Drawing Sheets

METHOD FOR FABRICATING SRAM CELL

RELATED APPLICATION

The present application is a divisional application of U.S. application Ser. No. 10/012,491 filed Dec. 12, 2001 (now U.S. Pat. No. 6,635,966), the entire contents of which are herein fully incorporated by reference.

The present application claims the foreign priority benefit of Korean Patent Application No. 2001-23404 filed Apr. 30, 2001, the entire contents of which are herein fully incorporated by reference.

BACKGROUND OF THE INVENTION

1. Field of the Invention

The present invention relates to a semiconductor device, and in particular to a static random access memory (SRAM) cell and a method of fabricating the SRAM cell, which can efficiently contact a gate and a junction region, and which can simultaneously form an LDD region and the junction region according to a single ion implantation process.

2. Description of the Background Art

As a semiconductor device, a conventional SRAM cell will now be explained in brief with reference to FIG. 1 showing an equivalent circuit indicating a memory cell thereof.

In general, the SRAM cell uses a p-type MOS as a load, and consists of six transistors.

In more detail, in the SRAM cell, a pair of access transistors Q3, Q4 (n-type MOS transistors), a pair of driving transistors Q1, Q2 (n-type MOS transistors), and a pair of load transistors Q5, Q6 (P-type MOS transistors) are connected one another to compose a flip-flop circuit.

Here, source regions 110b, 111b of the load transistors Q5, Q6 are connected to a power supply source Vcc, source regions of the driving transistors Q1, Q2 are connected to a ground voltage GND, and the access transistors Q3, Q4 are connected to storage nodes, respectively.

In addition, a bit line 107 is connected to one of source/drain regions of the access transistor Q3, a bit line 108 is connected to one of source/drain regions of the access transistor Q4, and gate electrodes G3, G4 of the access transistors Q3, Q4 are connected to a word line 109.

On the other hand, a drain region 111a of the load transistor Q6 and a gate electrode G5 of the load transistor Q5 are connected to each other through a contact (not shown).

In the above-described SRAM cell, however, it is difficult to form a contact to connect the p-type gate electrode G5 of the load transistor Q5 consisting of the p-type MOS transistor to the drain region 111a of the load transistor Q6 at a region indicated by a dotted circle A in FIG. 1. That is, an oxide film, which is formed on the gate electrode using an oxidation process prior to an application of an ion implantation process to form a junction for minimizing damage of active regions of the semiconductor substrate during the ion implantation process, is not completely removed. Thus, the top surface of the gate electrode is not fully exposed. Accordingly, the gate electrode G5 and the drain region 111a are not successfully connected to each other.

The conventional method for fabricating the SRAM cell will now be described in detail with reference to FIGS. 2 to 5.

FIGS. 2 to 5 are cross-sectional diagrams illustrating sequential steps of the conventional method for fabricating the SRAM cell.

As illustrated in FIG. 2, an undoped polysilicon layer 3 is formed on a semiconductor substrate 1 so as to form a p-type gate. B11 is firstly ion-implanted to the undoped polysilicon layer 3, and then As75 is ion-implanted thereto. Here, As75 is implanted to reduce contact resistance. As shown in FIG. 1, the p-type gate G5, the n-type gate G1, the p-type gate G6 and the n-type gate G2 are connected through one polysilicon to form a PN junction. In the case that a current flows in an NP direction, the PN junction serves as a resistor for controlling a flow of the current.

Accordingly, when the current flows in the NP direction, an ion-implanted region is operated as a path, and the ion-implantation region is formed by ion-implanting As75 to the undoped polysilicon layer 3.

Referring to FIG. 3, although not illustrated, a photoresist film pattern (not shown) exposing a gate formation region is formed on the undoped polysilicon layer 3. The polysilicon layer 3 is selectively patterned by using the photoresist film pattern as a mask, thereby forming a PMOS gate electrode 3a.

In an ion implantation process for forming a highly doped region and a lightly doped drain (LDD) region, an oxide film 5 is formed on the undoped polysilicon layer 3 according to an oxidation process in order to minimize damage of the active regions of the semiconductor substrate. Here, the oxide film 5 is unevenly grown at a thickness of 400 to 500 Å which is three or four times as thick as the thickness of an oxide film grown by using a general polysilicon oxidation process.

Thereafter, a low density impurity is ion-implanted to the exposed regions of the semiconductor substrate 1 by using the oxide film 5 and the gate electrode 3a as a mask, to form an LDD region 7 in the semiconductor substrate 1.

As depicted in FIG. 4, an insulating film material layer is then deposited over the resultant structure, and selectively removed according to an anisotropic etching process, thereby forming spacers 9 at the side portions of the oxide film 5 and the gate electrode 3a.

Thereafter, a high density impurity is ion-implanted to the exposed regions of the semiconductor substrate 1 by using the upper surface of the oxide film 5 and the spacers 9 as a mask, to form HDD regions 11 which will be employed as a source and drain.

As shown in FIG. 5, an interlayer insulating film 13 is deposited over the resultant structure. A photoresist film (not shown) is coated on the interlayer insulating film 13 to expose the HDD regions 11. The photoresist film is then selectively removed according to exposure and development processes of a photolithography process, thereby forming a photoresist film pattern (not shown).

The interlayer insulating film 13 and the oxide film 5 are selectively removed by employing the photoresist film pattern as a mask, to form a contact hole 15 exposing the HDD region 11. In the contact hole formation process, the oxide film 5 is not completely removed, and thus the top surface of the gate electrode 3a is not exposed.

Because of As75 doped at the interface of the ion-implanted polysilicon layer to reduce contact resistance, polysilicon at the interface is oxidized in the oxidation process at a thickness of 400 to 500 Å which is three or four times as thick as an oxidized layer provided by using the general oxidation process.

Therefore, in the process for connecting the gate electrode and the HDD region which is an active region, a thick portion of the oxide film remains as indicated by a dotted circle C of FIG. 5, and thus the upper surface of the gate 3a electrode is not fully exposed. As a result, the HDD region 11 and the gate electrode 3a are not connected electrically via a material to be formed in the contact hole 15.

In the oxidation process of the polysilicon gate electrode, the upper portion of the side wall 5a of the gate electrode 3a is more oxidized than the lower portion thereof, as indicated by a dotted circle B of FIG. 3. This produces a vertical polysilicon gate having a trapezoidal shape.

Accordingly, resistance of the gate operated as a contact portion of the NMOS gate and the PMOS gate is increased, which reduces the operation speed of the device.

SUMMARY OF THE INVENTION

Therefore, it is an object of the present invention to provide a static random access memory (SRAM) cell and a fabrication method thereof which can improve an operation speed of a device by preventing a polysilicon gate from being excessively oxidized.

Another object of the present invention is to provide an SRAM cell and a method for fabricating the SRAM cell which can simplify the entire fabrication process by forming an HDD region and an LDD region according to one ion implantation process.

Still another object of the present invention is to provide an SRAM cell and a method for fabricating the SRAM cell which can improve a process yield by reducing a contact defect between a polysilicon gate and an active region.

In order to achieve the above-described objects of the present invention, there is provided a method for fabricating a static random access memory (SRAM) cell, including the steps of providing a semiconductor substrate; forming a doped polysilicon layer on the semiconductor substrate; forming an undoped polysilicon layer on the doped polysilicon layer; forming a gate by patterning the undoped polysilicon layer and the doped polysilicon layer; forming an oxidation barrier film over the resultant structure including the gate; forming a sacrificial spacer at the side portions of the oxidation barrier film; removing the exposed portion of the oxidation barrier film and the sacrificial spacer; oxidizing the resultant structure according to an oxidation process; forming a lightly-doped drain region and a highly-doped drain region, by ion-implanting a high density impurity to the semiconductor substrate below both side portions of the oxidation barrier film; forming an interlayer insulating film on the exposed surface of the resultant structure; exposing the top surface of the gate and the highly-doped drain region by selectively patterning the interlayer insulating film and the undoped polysilicon layer; and connecting the gate and the highly-doped drain region by forming a conductive material over the resultant structure.

In another aspect of the present invention, a method for fabricating an SRAM cell includes the steps of: providing a semiconductor substrate; forming a polysilicon layer on the semiconductor substrate; doping the polysilicon layer, by sequentially ion-implanting a first conductive type impurity and a second conductive type impurity thereto; forming an undoped polysilicon layer on the doped polysilicon layer; forming a gate by patterning the undoped polysilicon layer and the doped polysilicon layer; forming a nitride film over the resultant structure including the gate; forming a sacrificial spacer at the side portions of the nitride film; removing the exposed portion of the nitride film; removing the sacrificial spacer; oxidizing the resultant structure according to an oxidation process; forming a lightly-doped drain region and a highly-doped drain region at the same time by ion-implanting a high density impurity to the semiconductor substrate below both side portions of the nitride film; forming an interlayer insulating film on the exposed surface of the resultant structure; exposing the top surface of the gate and the highly-doped drain region by selectively patterning the interlayer insulating film, the oxide film and the undoped polysilicon layer; and connecting the gate and the highly-doped drain region by forming a conductive material over the resultant structure.

In still another aspect of the present invention, a method for fabricating an SRAM cell includes the steps of: providing a semiconductor substrate; forming a polysilicon layer on the semiconductor substrate; doping an undoped polysilicon layer by sequentially ion-implanting a p-type impurity and an n-type impurity to the polysilicon layer; forming an undoped polysilicon layer on the doped polysilicon layer; forming a gate by patterning the undoped polysilicon layer and the doped polysilicon layer; forming a nitride film over the resultant structure including the gate; forming a photoresist spacer at the side portions of the nitride film; removing the exposed portion of the nitride film; removing the photoresist spacer; oxidizing the resultant structure according to an oxidation process; forming a lightly-doped drain region and a highly-doped drain region at the same time by ion-implanting a high density impurity to the semiconductor substrate below both side portions of the nitride film; forming an interlayer insulating film on the exposed surface of the resultant structure; exposing the top surface of the gate and the highly-doped drain region by selectively patterning the interlayer insulating film and the undoped polysilicon layer; and connecting the gate and the highly-doped drain region by forming a conductive material over the resultant structure.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

A method for fabricating a static random access memory (SRAM) cell in accordance with a preferred embodiment of the present invention will now be described in detail with reference to the accompanying drawings.

FIGS. 6 to 11 are cross-sectional diagrams illustrating sequential steps of the method for fabricating an SRAM cell in accordance with one embodiment of the present invention.

Figure 1:
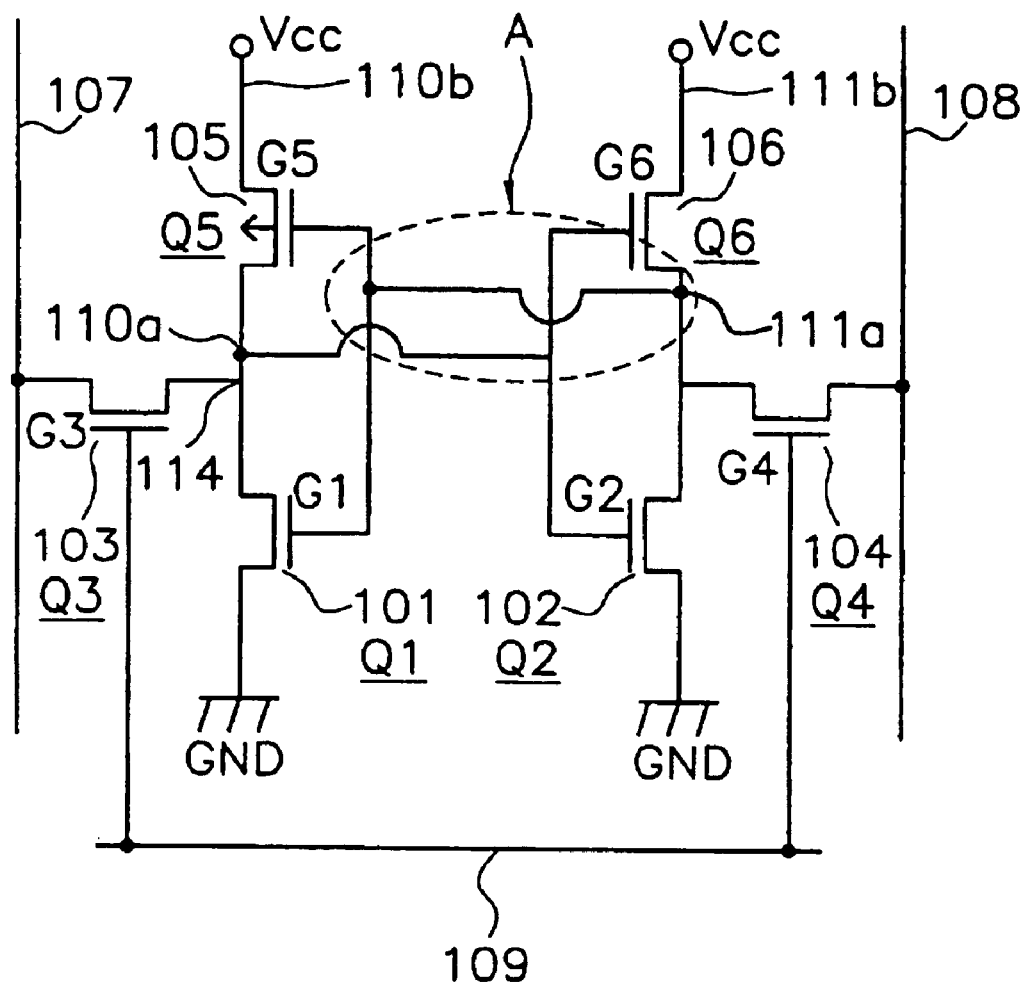
FIG. 1 is a circuit diagram of a general SRAM cell.
Figure 2:
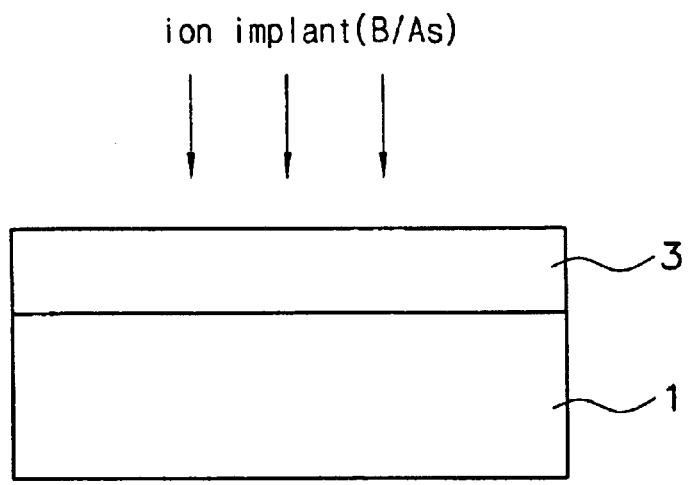
FIGS. 2 through 5 are cross-sectional diagrams illustrating sequential steps of a conventional method for fabricating a conventional SRAM cell.
Figure 3:
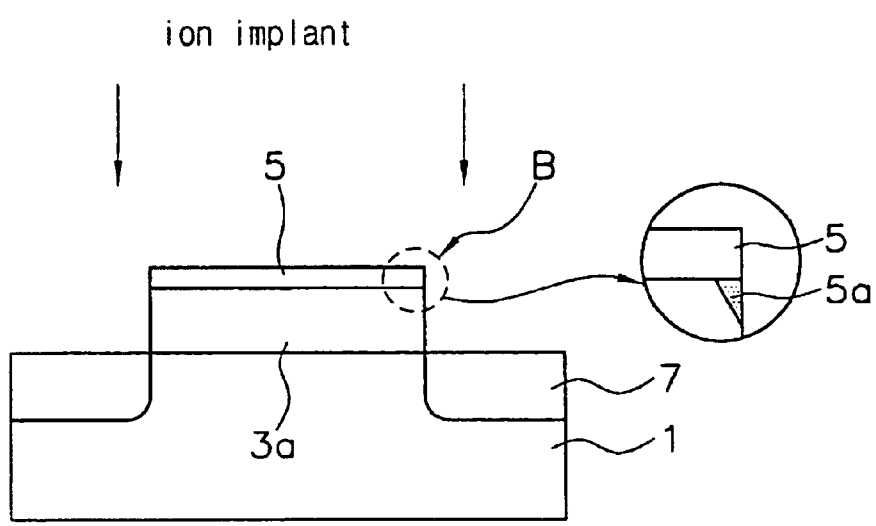
Figure 4:
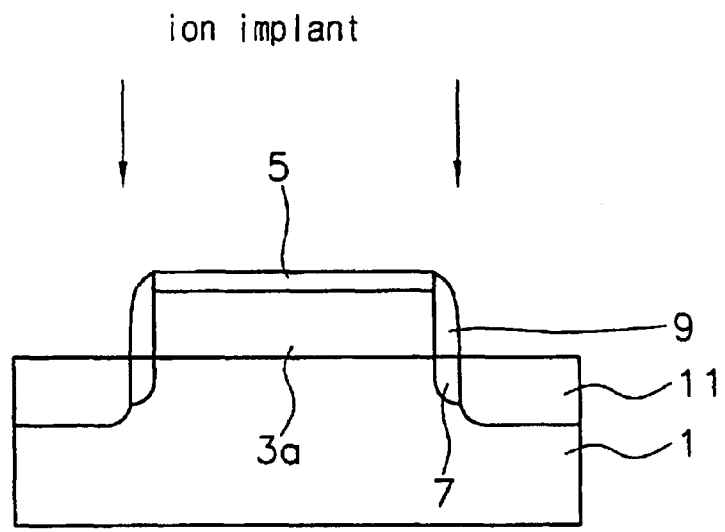
Figure 5:
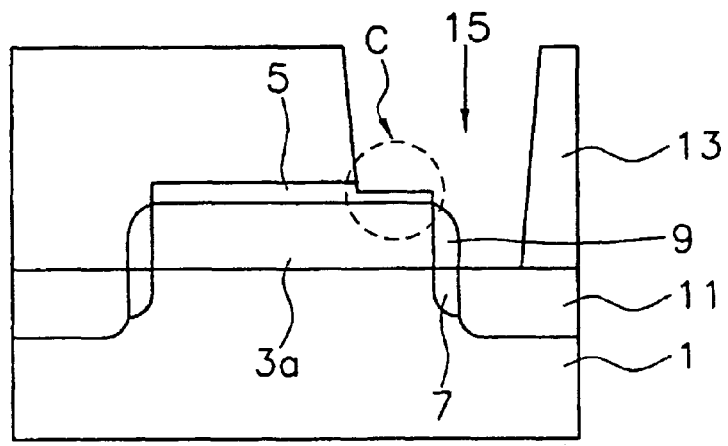
Figure 6:
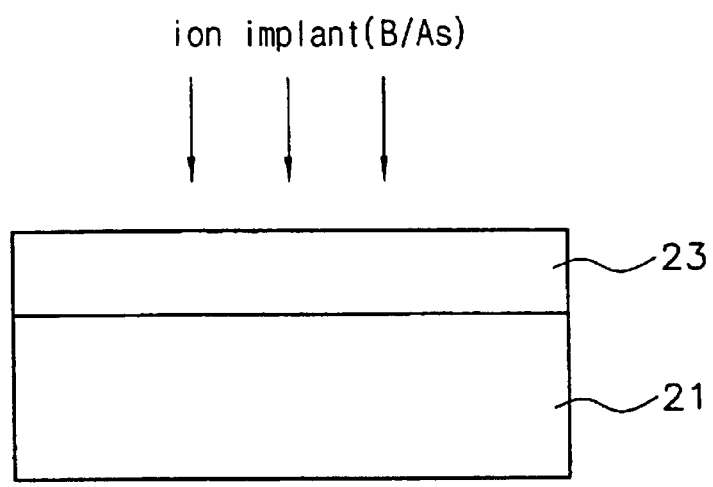
FIGS. 6 through 11 are cross-sectional diagrams illustrating sequential steps of a method for fabricating an SRAM cell in accordance with one embodiment of the present invention.

Referring to FIG. 6, in according with the fabrication method, a semiconductor substrate 21 having an element isolating film (not shown) is provided. The element isolating film defines active regions where a plurality of NMOS and PMOS composing the SRAM cell will be formed. Here, an explanation of fabrication process for the NMOS is omitted.

Then, a first undoped polysilicon layer 23 is formed on the semiconductor substrate 21. In order to form a p-type gate, an impurity such as B11 is first ion-implanted to the first undoped polysilicon layer 23, and then an impurity such as As75 is ion-implanted thereto. At this time, As75 in the polysilicon layer 23 decreases contact resistance and functions as a current path between a p-type gate and an n-type gate.

Figure 7:
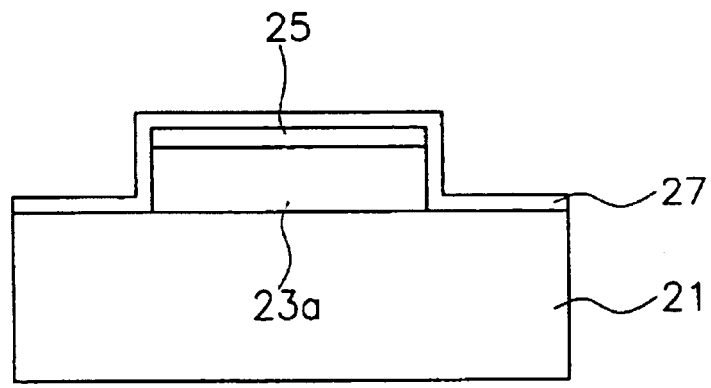

Referring to FIG. 7, a second undoped polysilicon layer 25 is formed on the first undoped polysilicon layer 23 at a certain thickness, e.g., about 70 to 130 Å.

Although not illustrated, a photoresist film pattern is then formed on the second undoped polysilicon layer 25 to expose a gate formation region thereof. The second undoped polysilicon layer 25 and the first undoped polysilicon layer 23 are selectively patterned by using the photoresist film pattern as a mask, thereby forming a gate electrode 23a of the PMOS.

Thereafter, the entire photoresist film pattern is removed, and a nitride film 27 is deposited on the exposed surface of the resultant structure including the second undoped polysilicon layer 25. The nitride film 27 serves as a barrier film for preventing oxidation of the side walls of the gate electrode 23a. In other embodiments, other types of oxidation barrier films can be used in lieu of the nitride film 27.

Figure 8:
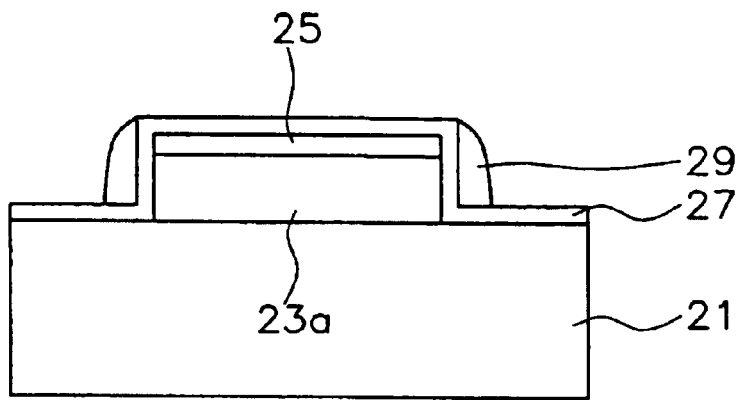

As depicted in FIG. 8, an insulating film is then formed on the nitride film 27 and selectively removed according to an anisotropic etching process or other techniques, to form sacrificial spacers 29 at the side portions of the nitride film 27 covering the gate electrode 23a. Exemplary insulating films for forming the sacrificial spacers include, but are not limited to, photoresist materials and SOG materials.

Figure 9:
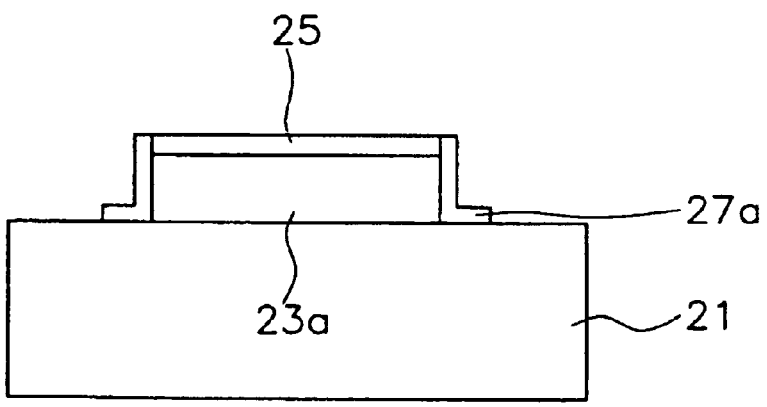

As shown in FIG. 9, exposed portions of the nitride film 27 are selectively removed according to a blanket etching process or other techniques, and then the entire sacrificial spacers 29 are removed. Here, the nitride film 27 may be etched by using a mask, instead of using the blanket etching process. As, a result, a nitride film pattern 27a remains on the substrate 21.

Figure 10:
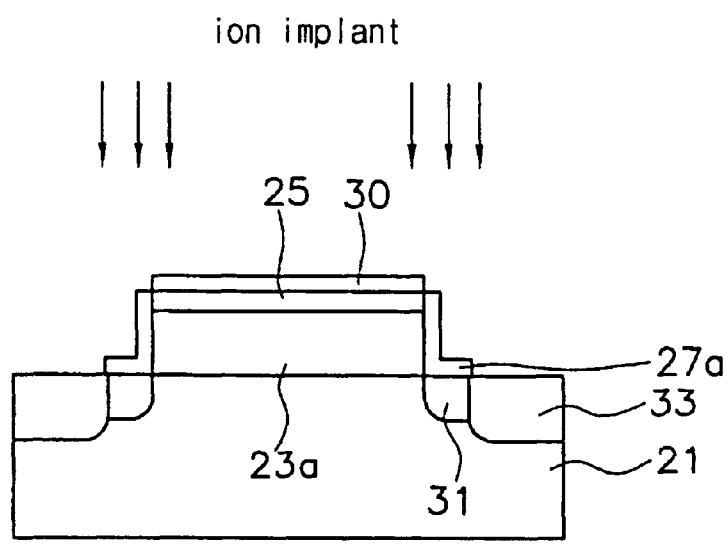

Referring to FIG. 10, the surface of the resulting structure is oxidized according to an oxidation process to minimize damage of the active regions of the semiconductor substrate 1 during the ion implantation process for forming HDD and LDD regions. This produces an oxide film 30 formed on the second undoped polysilicon layer 25 at a certain thickness, e.g., about 70 to 130 Å. However, the oxide film 30 is not formed at the side walls of the gate electrode 23a due to the presence of the nitride film pattern 27a.

Then, a high density impurity is ion-implanted to the semiconductor substrate 21 below both side portions of the nitride film pattern 27a remaining at the side portions of the gate electrode 23a, to form a Lightly Doped Drain (LDD) region 31 and a Highly Doped (HDD) region 33 at the same time. That is, both the LDD region 31 and HDD region 33 are formed using a single ion implantation process. The LDD region 31 is formed in the semiconductor substrate 21 in contact with the nitride film pattern 27a, and the HDD region 33 is formed in the semiconductor substrate 21. Here, the substrate 21 does not contact the nitride film pattern 27a.

Figure 11:
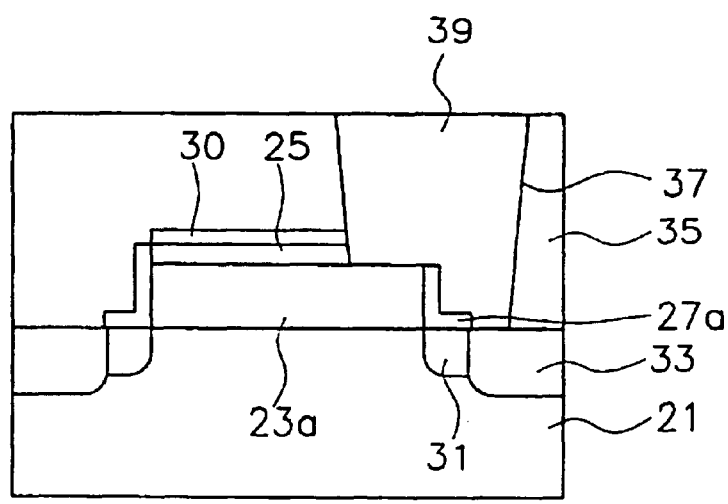

As illustrated in FIG. 11, an interlayer insulating film 35 is formed over the resultant structure. A photoresist film (not shown) is coated on the interlayer insulating film 35 to expose a portion of the HDD region 33. Then, a photoresist film pattern is formed by selectively removing the photoresist film according to exposure and development processes of a photolithography process or other techniques.

The interlayer insulating film 35, the oxide film 30 and the second undoped polysilicon layer 25 are selectively removed by using the photoresist film pattern (not shown) as a mask, thereby forming a contact hole 37 to expose portions of the gate electrode 23a, the nitride film pattern 27a and HDD region 33. Here, a total thickness of the oxide film 30 and the second undoped polysilicon layer 25 is, but not limited to, about 200 Å, and thus the oxide film 30 and the second undoped polysilicon layer 25 can be easily removed to expose the top surface of the gate electrode 23a.

Then, a metal material is deposited in the contact hole 37 and patterned to form an interconnection 39 for connecting electrically the gate electrode 23a to the HDD region 33.

As discussed earlier, the method for fabricating the SRAM cell in accordance with the present invention has many advantages including the following:

The oxidation process is not unevenly and excessively performed on the polysilicon gate, and thus a contact defect does not occur between the gate and active regions, which results in an improved process yield.

Moreover, the nitride film pattern is formed at the side portions of the polysilicon layer in order to minimize damage during the ion implantation process for forming the HDD region. Therefore, the upper portion of the side wall of the polysilicon gate is not oxidized more than the lower portion thereof, thereby improving the operation speed of the device.

In addition, the highly doped region (HDD region) and LDD region are formed at the same time using a single ion implantation process, since the nitride film pattern is formed at the side portions of the polysilicon gate. As a result, the entire fabrication process for the SRAM cell is simplified.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A method of fabricating a semiconductor device, comprising the steps of:

forming a gate on a substrate;

forming an oxidation barrier film on side portions of the gate;

oxidizing the resultant structure by using an oxidation process and thereby forming an oxide film on a top surface of the gate;

implanting high density impurity ions to the substrate to form a lightly doped region and a highly doped region in the substrate at side portions of the gate;

forming an insulating layer over the substrate to define a contact hole that exposes portions of the gate and the highly doped region; and forming an interconnect in the contact hole to connect the gate and the highly doped region.

2. The method according to claim 1, wherein the step of forming the gate includes the steps of:

forming a doped polysilicon layer on the substrate, forming an undoped polysilicon layer on the doped polysilicon layer, and patterning the undoped polysilicon layer and the doped polysilicon layer to form the gate.

3. The method according to claim 2, wherein the step of forming the doped polysilicon layer includes the steps of:

forming another undoped polysilicon layer on the substrate, ion-implanting a P-type impurity to this undoped polysilicon layer, and ion-implanting an N-type impurity to this undoped polysilicon layer.

4. The method according to claim 1, wherein, in the implanting step, the lightly doped region and the highly doped region are formed at the same time by using a single ion implantation process.

5. The method according to claim 1, wherein the oxidation barrier film is a nitride layer.

6. The method according to claim 1, in the oxidizing step, the oxide film has a uniform thickness.

7. The method according to claim 6, wherein the oxide film has a thickness of about 70–130 Å.

8. A method of fabricating a static random access memory cell, comprising the steps of:

providing a semiconductor substrate;

forming a doped polysilicon layer on the semiconductor substrate;

forming an undoped polysilicon layer on the doped polysilicon layer;

forming a gate by patterning the undoped polysilicon layer and the doped polysilicon layer;

forming an oxidation barrier film over the resultant structure including the gate;

forming sacrificial spacers at the side portions of the oxidation barrier film;

removing exposed portions of the oxidation barrier film and the sacrificial spacers;

oxidizing the resultant structure by an oxidation process;

ion-implanting a high density impurity to the semiconductor substrate below both side portions of the oxidation barrier film to form a lightly doped region and a highly doped region;

forming an interlayer insulating film on the exposed surface of the resultant structure;

selectively patterning the interlayer insulating film and the undoped polysilicon layer to expose a portion of the gate and a portion of the highly doped region; and forming a conductive material layer over the resultant structure to connect the gate to the highly doped region.

9. The method according to claim 8, wherein the step of forming the doped polysilicon layer comprises the steps of:

forming an undoped polysilicon layer on the semiconductor substrate, and ion-implanting a p-type impurity to the undoped polysilicon layer.

10. The method according to claim 9, wherein the p-type impurity is B11.

11. The method according to claim 9, further comprising the step of:

ion-implanting an n-type impurity to the undoped polysilicon layer after the step of ion-implanting the p-type impurity to the undoped polysilicon layer.

12. The method according to claim 8, wherein the oxidation barrier film is a nitride film.

13. The method according to claim 8, wherein the sacrificial spacers are made of a photoresist or SOG material.

14. The method according to claim 8, wherein, in the step of removing the oxidation barrier film and the sacrificial spacers, the oxidation barrier film is removed first, and then the sacrificial spacers are removed.

15. The method according to claim 14, wherein the oxidation barrier film is removed by a blanket etching process or using a mask.

16. The method according to claim 8, wherein, in the oxidizing step, an oxide film is formed on the undoped polysilicon layer at a thickness of 70–130 Å during the oxidation process.

17. The method according to claim 8, wherein the undoped polysilicon layer is formed at a thickness of 70–130 Å.

18. The method according to claim 8, wherein the lightly doped region and the highly doped region are formed at the same time.

19. The method according to claim 8, wherein, in the ion-implanting step, the lightly doped region is formed in the semiconductor substrate and in contact with the oxidation barrier film, and the highly doped region is formed in the semiconductor substrate which does not contact the oxidation barrier film.

20. The method according to claim 8, wherein the oxidation barrier film is used as a gate spacer.

21. The method according to claim 8, wherein the lightly doped region is a drain region.

* * * * *